United States Patent
Haug

(10) Patent No.: US 11,996,871 B2
(45) Date of Patent: May 28, 2024

(54) TRANSMITTER HOUSING

(71) Applicant: Thomas Haug, Birkenfeld (DE)

(72) Inventor: Thomas Haug, Birkenfeld (DE)

(*) Notice: Subject to any disclaimer, the term of this patent is extended or adjusted under 35 U.S.C. 154(b) by 144 days.

(21) Appl. No.: 17/599,643

(22) PCT Filed: Mar. 6, 2020

(86) PCT No.: PCT/EP2020/055962
§ 371 (c)(1),
(2) Date: Sep. 29, 2021

(87) PCT Pub. No.: WO2020/200643
PCT Pub. Date: Oct. 8, 2020

(65) Prior Publication Data
US 2022/0038123 A1 Feb. 3, 2022

(30) Foreign Application Priority Data

Apr. 5, 2019 (DE) .................... 20 2019 101 984.0

(51) Int. Cl.
*H04B 1/034* (2006.01)
*H05K 5/02* (2006.01)

(52) U.S. Cl.
CPC ........... *H04B 1/0346* (2013.01); *H05K 5/023* (2013.01)

(58) Field of Classification Search
CPC ...... H04B 1/0346; H05K 5/023; B66C 13/40; H01H 9/0235; H01Q 1/44; H01Q 1/24
See application file for complete search history.

(56) References Cited

U.S. PATENT DOCUMENTS 9,107,488 B1* 8/2015 Cordes .................. F16M 11/22
11,082,587 B2* 8/2021 Basulto .................. H04N 23/50
(Continued)

FOREIGN PATENT DOCUMENTS

DE   20 2010 007 057 U1   8/2010
DE   29 2013 102 253 U1   6/2013
(Continued)

OTHER PUBLICATIONS

"Enrange MLTX2 Bellybox Transmitter", Canada, www.magnetekhydraulic.com, Mar. 16, 2012, URL: http://www.proportionalradiocontrols.com/pdf/MLTX-Belly-Box-Radio-Brochure.pdf, XP055186202, pp. 1-2.
(Continued)

*Primary Examiner* — James Wu
*Assistant Examiner* — Christopher L Augustin
(74) *Attorney, Agent, or Firm* — Birch, Stewart, Kolasch & Birch, LLP

(57) ABSTRACT

A transmitter housing of an operating device for devices and installations, such as in particular remote-controlled mobile, industrial or commercial devices and installations, has a housing wall which encloses a receptacle, wherein at least one operating element is mounted on an outer side of the housing wall and control electronics are accommodated in the receptacle, and two retaining elements, which close the receptacle, which are connected to a left-hand end and a right-hand end of the housing wall and therein project beyond the contour of the housing wall on all sides of the latter. Therein it is provided that the retaining elements are produced from an elastomer material at least in a respective contact region with the housing wall.

17 Claims, 4 Drawing Sheets

(56) References Cited

U.S. PATENT DOCUMENTS

Figure 1:
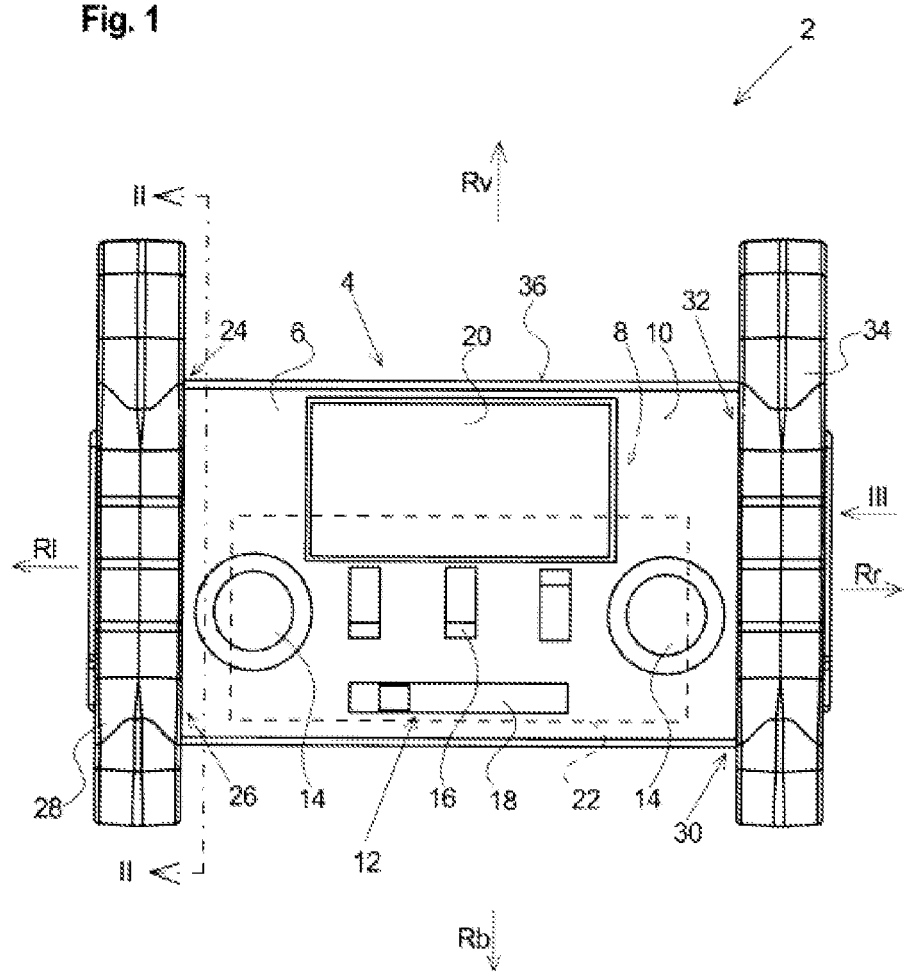

| | | | | |
|---|---|---|---|---|
| 2010/0044008 A1* | 2/2010 | Drummy | ............... | H05K 7/202 |
| | | | | 165/80.2 |
| 2010/0110620 A1* | 5/2010 | Haug | .................... | B66C 13/40 |
| | | | | 361/679.01 |
| 2012/0224318 A1* | 9/2012 | Carleton | ............. | G06F 1/1628 |
| | | | | 206/576 |
| 2014/0285968 A1* | 9/2014 | Budge | ................. | F16M 11/041 |
| | | | | 361/679.56 |
| 2015/0194993 A1* | 7/2015 | Sajady | ................ | H04B 1/3888 |
| | | | | 455/575.1 |
| 2017/0073198 A1 | 3/2017 | Haug | | |

FOREIGN PATENT DOCUMENTS

| | | | | |
|---|---|---|---|---|
| DE | 202013102253 U1 * | 8/2013 | ............ | H04M 1/185 |
| JP | 2008-112905 A | 5/2008 | | |
| WO | WO 2008/055480 A1 | 6/2008 | | |

OTHER PUBLICATIONS

Control Chief Wireless Solutions, "L Series Industrial Wireless Radio Remote Control System", Internet: controlchief.com, May 9, 2010, URL: https://www.controlchief.com/, XP055385417, pp. 1-2.
International Search Report, issued in PCT/EP2020/055962, dated Jun. 17, 2020.

\* cited by examiner

TRANSMITTER HOUSING

The invention relates to a transmitter housing of an operating device for devices and installations, such as in particular remote-controlled mobile, industrial or commercial devices and installations, according to the generic term of claim 1. The transmitter housing has a housing wall which encloses a receptacle, wherein at least one operating element, such as a control stick or joystick, a switch or controller and/or a touch-sensitive display, is mounted on an outer side of the housing wall. In addition, a control electronics is accommodated in the receptacle enclosed by the housing wall. Furthermore, two retaining elements are provided, of which a first retaining element is connected to a left-hand end and a second retaining element is connected to a right-hand end of the housing wall. In this way, the retaining elements close the receptacle enclosed by the housing wall. The retaining elements therein project beyond the contour of the housing wall on all sides, i.e. in an upper, lower, front, rear, left-hand and right-hand direction.

An operating device for remote controls is known from WO2008/055480A1, in which the housing wall is composed of two profile elements cut to length. An X-shaped retaining element consisting of a moulded plastic part is attached to each end of the housing wall formed in this way. The lower arms of the retaining elements formed by the X-shape serve as feet, while rods are held between the upper retaining arms, which serve as additional hand rests and/or as protection for the operating elements.

The task of the invention is to increase the protection of the components required for the operation of the operating device in a transmitter housing of the type with simple production and to further improve the operating comfort.

This task is solved by a transmitter housing with the features of claim 1. In this case, the retaining elements are formed from an elastomer material, such as rubber, at least in the respective contact region with the housing wall. In this way, a certain sealing of the receptacle can already be achieved by the connection of the retaining elements to the housing wall. Depending on the intended use of the operating device, sufficient sealing of the receptacle to the outside can thus be achieved by selecting a suitable elastomer material and by creating sufficient prestress in the relevant contact region, such as by means of a screw connection, even without additional sealing means, whereby the manufacturing costs and the assembly effort can be reduced. In the case of particularly high requirements for leak tightness, additional sealing means can alternatively be provided in the respective contact region between the two retaining elements and the housing wall.

In this case, it is advantageous when a respective circumferential outer contour of the retaining elements is additionally produced from the elastomer material. In this way, the two retaining elements have a circumferential shock-absorbing or energy-absorbing deformability, by means of which the housing wall or operating elements and electronic components held thereon can be effectively protected against impacts in all directions, such as in particular when the operating device falls.

In a particularly advantageous embodiment, both retaining elements have a base body produced entirely from the elastomer material. This allows the retaining elements to be easily produced even with relatively complex or filigree functional or design mouldings. In addition, a retaining element with such a base body produced from elastomer material can ensure a particularly high level of protection for the components, such as electronic or electrical components in particular, which are accommodated on the housing wall and/or the retaining elements themselves.

In this context, it is advantageous when the retaining elements each form two base-side corner regions produced from the elastomer material below the housing wall, which also extend beyond the extension of the housing wall on the front and rear sides. This makes it possible to place the operating device in a particularly shockproof and non-slip manner, wherein the base-side corner regions extending beyond the housing wall can avoid impacts acting directly on the housing wall, in particular in the event of a jerky placing down or falling down.

Advantageously, the retaining elements also each have two top-side corner regions produced from the elastomer material above the housing wall, which also extend beyond the extension of the housing wall on the front and rear sides. The top-side corner regions extending beyond the housing wall can accommodate impacts acting directly from above on the housing wall, such as during operation or by dropping the operating device.

In addition, it is particularly advantageous when the retaining elements on the base-side corner regions and/or on the top-side corner regions form at least one inner corner contour which is shielded from the outside by a reversible bumper bracket, forming a free intermediate space. In this case, the bumper bracket forms a relatively strongly deformable element, which thus has a particularly high shock-absorbing or energy-absorbing effect. The corner region in question can thus also protect the housing wall and the components mounted on it against relatively strong impact effects.

Advantageously, both retaining elements form the inner corner contour, which is shielded from the outside by the reversible bumper bracket, respectively at all four corner regions, forming the free intermediate space. In this way, the housing wall and the components accommodated on it can be protected on all sides against relatively strong impact effects, whereby the operating device has sufficient stability or energy-absorbing properties even at large drop heights.

Furthermore, it is advantageous when the bumper bracket is arc shaped at the respective free intermediate space. Due to the arc shape, the bumper brackets can on the one hand generate relatively high support forces against external force loads. On the other hand, due to the relatively large deformable length of the bumper brackets, the arc shape already enables better absorption of acting energy by design.

In a further advantageous embodiment, the bumper bracket and the associated free intermediate space each extend from one side to at least one further side of the retaining element, preferably over an angular range of at least 90°. In this way, the housing wall and the components held thereon can be shielded in at least two directions by only a single bumper bracket.

Furthermore, it is favourable when at least one of the bumper brackets together with the associated free intermediate space extends from a first side over an entire second side to a third side of the retaining element. In this way, the housing wall and the components held thereon can be shielded in at least three directions by only a single bumper bracket.

Advantageously, a recessed grip is formed in the associated free intermediate space on the second side. This allows the operating device to be held particularly comfortably, wherein the holding hand of the user is also shielded by the bumper bracket and thus protected from external impact effects.

In addition, it is favourable when an additional protective bracket is formed on one side of the retaining elements between two of the bumper brackets, on which an additional recessed grip is formed in order to be able to provide the user with an additional protected gripping position.

Furthermore, an antenna is advantageously accommodated in at least one of the bumper brackets. Such a receptacle for the antenna in the bumper bracket allows a relatively large extension of the antenna and, in particular when the bumper bracket is produced from rubber, an undisturbed transmission and/or reception performance.

In addition, it is favourable when an additional receptacle is let into at least one of the retaining elements, which is accessible via an end face of the retaining element. The additional receptacle can either be formed with a through-opening towards the receptacle in order to be able to access the receptacle of the housing wall through it. Alternatively, the additional receptacle can also be let into the end face of the retaining element in such a way that it forms a closed base towards the receptacle. In any case, such an additional receptacle offers a particularly high level of protection of the components against external influences, despite convenient and easy access possibilities. This means that additional electrical or electronic components, such as switching or sensor elements or a battery shaft, can be accommodated in a protected manner on both retaining elements.

Advantageously, a battery shaft is inserted into the at least one additional receptacle. In this way, the batteries or rechargeable batteries required for the power supply of the operating device can be accommodated in a particularly well-protected manner, wherein the additional receptacle let into the retaining element enables a secure seal to the outside. In addition, the batteries or rechargeable batteries are particularly easy to access in this way, in particular for charging or replacement.

Furthermore, it is favourable when a bearing element can be inserted into the additional receptacle, which can be prestressed on the housing wall, which is preferably produced from metal, with the retaining element interposed. In this way, a stable and sealing fixation of the respective retaining element to the housing wall is possible.

It is pointed out that all the above-described features of the object according to the invention are interchangeable or combinable with one another, provided that an exchange or a combination thereof is not precluded for technical reasons.

Figure 2:
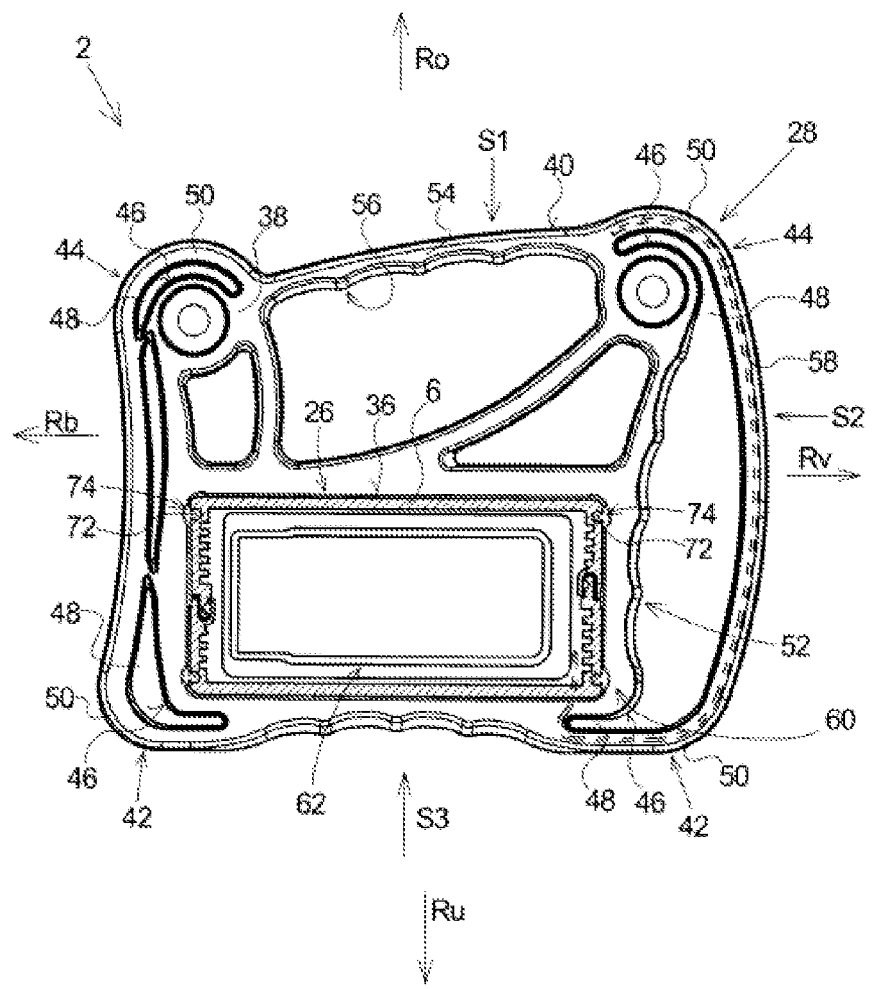
Figure 3:
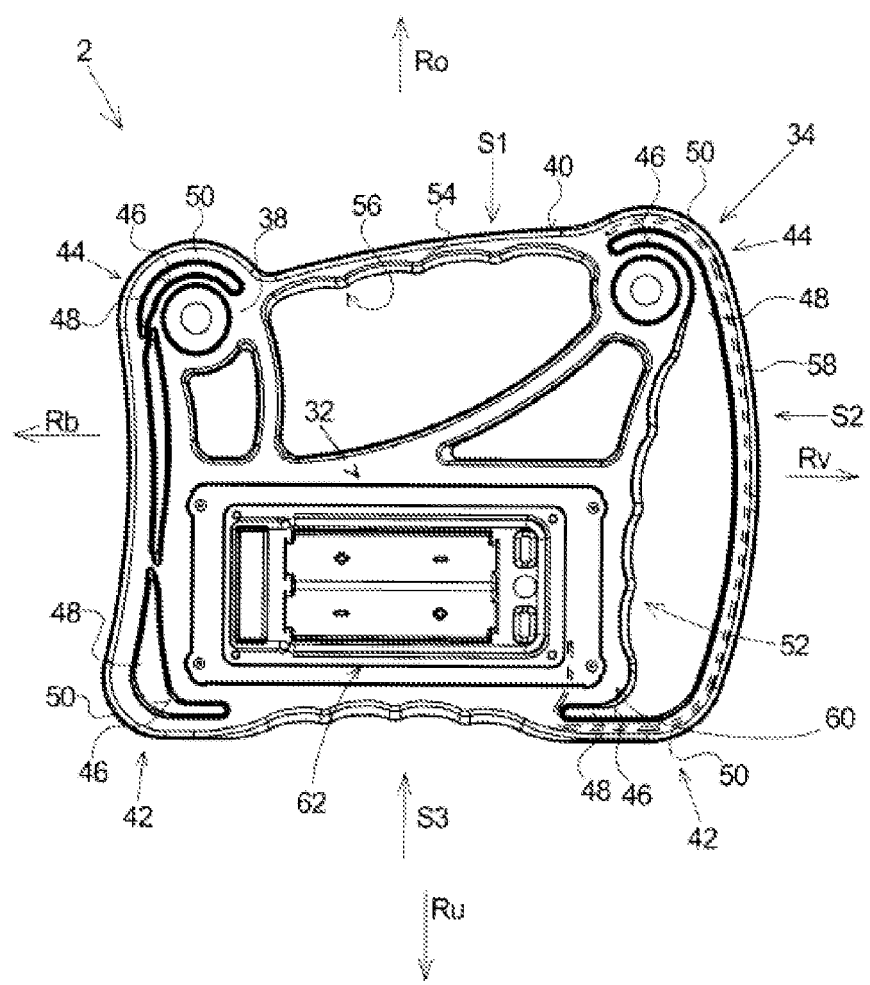
Figure 4:
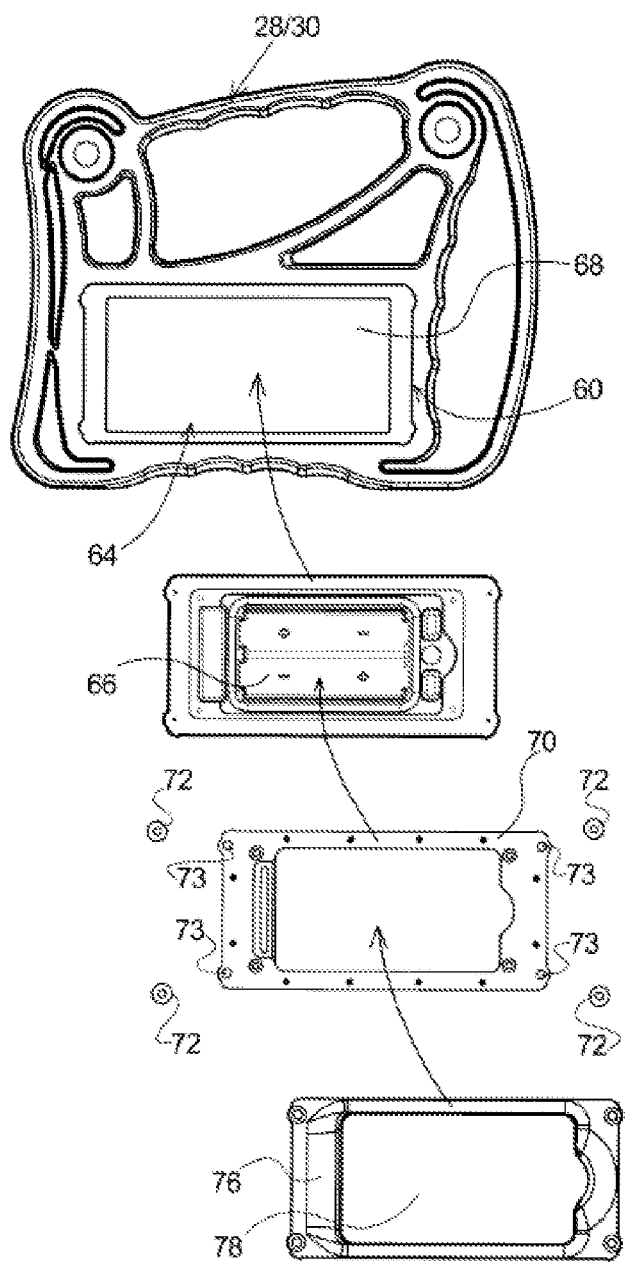

The figures show an exemplary embodiment of the invention. They show:

FIG. 1 a top view of an operating device with a transmitter housing according to the invention, FIG. 2 a sectional view of the transmitter housing in plane II-II from FIG. 1, FIG. 3 a view of the transmitter housing in direction III from FIG. 1 and FIG. 4 an exploded view of an additional receptacle of the transmitter housing.

FIG. 1 shows an operating device 2 in the form of a remote control for devices and installations, such as in particular remote-controlled mobile, industrial or commercial lifting or transport installations. The operating device 2 has a transmitter housing 4 with a housing wall 6 which encloses a receptacle 8. Various operating elements 12 are mounted on an outer side 10 of the housing wall 6, which are shown by way of example as joysticks 14, switches 16, controllers 18 and a touch-sensitive screen 20. These are connected to a control electronics 22 for operating the operating device 2, which are accommodated in the receptacle 8 in a protected manner.

As can further be seen from FIG. 1, the housing wall 6 is connected at a left-hand end 24 via a first contact region 26 to a first retaining element 28 and at a right-hand end 30 via a second contact region 32 to a second retaining element 34. The two retaining elements 26, 30 are arranged in such a way that they project beyond a contour 36 of the housing wall 6 in the left-hand direction Rl, right-hand direction Rr, front direction Rv and rear direction Rb.

Furthermore, as can be seen from the retaining elements 28, 34 shown in FIGS. 2 and 3, they also project beyond the contour 36 of the housing wall 6 in a top-side direction Ro and a base-side direction Ru. In this respect, the retaining elements 28, 34 have a base body 38 which forms both the respective contact region 26, 32 and a circumferential outer contour 40 of the retaining elements 28, 34 and which is produced entirely from an elastomer material, such as rubber in particular. The first retaining element 28 and the correspondingly formed second retaining element 34 can thus function as shock-absorbing elements of the operating device 2 due to their material properties and their arrangement relative to the housing wall 6, which have an energy-absorbing effect against forces acting from outside.

As can further be seen from FIGS. 2 and 3, the base bodies 38 each form two base-side corner regions 42 below the housing wall 6 in the regions protruding beyond the housing wall 6 in the front direction Rv and in the rear direction Rr. The operating device 2 can be placed on these to prevent it from slipping. Furthermore, the base bodies 38 each form two top-side corner regions 44 above the housing wall 6 in the regions projecting beyond the housing wall 6 in the front direction Rv and in the rear direction Rr.

An inner corner contour 46 is provided at all corner regions 42, 44, which is shielded from the outside by a reversible bumper bracket 50, forming a free intermediate space 48. The bumper brackets 50 each extend in an arc shape over an angular portion of at least 90° from one side to another side of the respective retaining element 28, 34. In addition, the bumper bracket 50 extends at the front from a top side S1 over the entire front side S2 to a base side S3 of the respective retaining element 28, 34. A recessed grip 52 is also formed at the front side S2 below the bumper bracket 50. Furthermore, on the top side S1 between two of the bumper brackets 50, a protective bracket 54 is additionally formed, which extends over an additional recessed grip 56.

As can also be seen from FIGS. 2 and 3, the front bumper bracket 50 is used in each case for the protected receptacle of an antenna 58, wherein the amorphous rubber material of the bumper bracket 50 enables an undisturbed transmitting and receiving function in this case.

In addition, an additional receptacle 62 is provided in one end face 60 of each of the retaining elements 28, 34. As can be seen in particular from FIG. 4, this consists exemplarily of a material recess 64 let into the end face 60, into which a battery shaft 66 can be inserted. Alternatively or in addition to this, other additional electrical or electronic components can also be accommodated in a protected manner on the additional receptacles 62, such as switching or sensor elements (not shown). The material recess 64 can either be formed with a through opening 68, as shown, so that access to the receptacle 8 is free when the battery shaft 66 is removed. Alternatively, the material recess 64 can be formed with a closed bottom (not shown) to enable a particularly secure sealing of both the battery shaft 66 and the receptacle 8 from the outside.

Furthermore, a bearing element 70, such as in particular a metal plate, is provided, which, as shown, is formed separately or alternatively can also be integrated into the battery shaft 66. This serves for the receptacle of screws 72, which can be screwed through corresponding bores 73 into screw receptacles 74 of the housing wall 6 with interposition of the respective retaining element 28; 34 (see FIG. 2), in order to clamp the respective retaining element 28; 34 to the housing wall 6. Due to the elastomer material in the contact regions 26, 32, the retaining elements 28, 34 can themselves be prestressed against the housing wall 6 in a sealing manner. If necessary, additional sealing means can be provided in the contact regions 26, 32 to increase the leak tightness (not shown).

A frame part 76, which is screwed together with the bearing element 70 and into which a cover 78 can be inserted, also serves to close the battery shaft 66.

It should be noted that all of the above-described elements and features of the various embodiments of the object according to the invention are interchangeable or combinable with one another, provided that an interchange or combination thereof is not ruled out for technical reasons.

The invention claimed is:

1. A transmitter housing of an operating device for devices and installations, comprising:
a housing wall enclosing a receptacle, wherein at least one operating element is mounted on an outer side of the housing wall and control electronics are accommodated in the receptacle; and
two retaining elements closing the receptacle and being connected to a left-hand end and a right-hand end of the housing wall and projecting beyond a contour of the housing wall on all sides, thereof,
wherein the two retaining elements are produced from an elastomer material at least in a respective contact region with the housing wall,
wherein the two retaining elements each have two base-side corner regions, produced from the elastomer material below the housing wall, which also extend beyond an extension of the housing wall on the front and rear sides,
wherein the two retaining elements at the base-side corner regions and/or at top-side corner regions form at least one inner corner contour which is shielded from the outside by a reversible bumper bracket while forming a free intermediate space, and
wherein at least one of the bumper brackets together with the associated free intermediate space extends from a first side over an entire second side to a third side of the retaining element.

2. The transmitter housing according to claim 1, wherein a respective circumferential outer contour of the two retaining elements is produced from the elastomer material.

3. The transmitter housing according to claim 1, wherein each of the two retaining elements have a base body produced entirely from the elastomer material.

4. The transmitter housing according to claim 1, wherein the two retaining elements each have two top-side corner regions produced from the elastomer material above the housing wall, which also extend beyond an extension of the housing wall on the front and rear sides.

5. The transmitter housing according to claim 1, wherein the two retaining elements form the inner corner contour, which is shielded from the outside by the reversible bumper bracket, respectively at all four corner regions, forming the free intermediate space.

6. The transmitter housing according to claim 1, wherein the bumper bracket is formed in an arc shape at the respective free intermediate space.

7. The transmitter housing according to claim 1, wherein the bumper bracket and the associated free intermediate space each extend from one side to at least one further side of the retaining element.

8. The transmitter housing according to claim 1, wherein a recessed grip is formed on the second side in the associated free intermediate space.

9. The transmitter housing according to claim 1, wherein on one side of the retaining elements between two of the bumper brackets a protective bracket is formed on which a recessed grip is formed.

10. The transmitter housing according to claim 1, wherein an additional receptacle is let into at least one of the two retaining elements, which is accessible via an end face of the retaining element.

11. The transmitter housing according to claim 10, wherein a battery shaft is inserted into the at least one additional receptacle.

12. The transmitter housing according to claim 10, wherein a bearing element can be inserted into the additional receptacle, which can be prestressed on the housing wall with the retaining element interposed.

13. The transmitter housing according to claim 2, wherein each of the two retaining elements have a base body produced entirely from the elastomer material.

14. The transmitter housing according to claim 2, wherein the two retaining elements each have two base-side corner regions, produced from the elastomer material below the housing wall, which also extend beyond an extension of the housing wall on the front and rear sides.

15. The transmitter housing according to claim 3, wherein the two retaining elements each have two base-side corner regions, produced from the elastomer material below the housing wall, which also extend beyond an extension of the housing wall on the front and rear sides.

16. The transmitter housing according to claim 2, wherein the two retaining elements each have two top-side corner regions produced from the elastomer material above the housing wall, which also extend beyond an extension of the housing wall on the front and rear sides.

17. A transmitter housing of an operating device for devices and installations, comprising:
a housing wall enclosing a receptacle, wherein at least one operating element is mounted on an outer side of the housing wall and control electronics are accommodated in the receptacle; and
two retaining elements closing the receptacle and being connected to a left-hand end and a right-hand end of the housing wall and projecting beyond a contour of the housing wall on all sides, thereof,
wherein the two retaining elements are produced from an elastomer material at least in a respective contact region with the housing wall,
wherein the two retaining elements have corner regions forming an inner corner contour and a bumper bracket spaced from each corner region by a free intermediate space, and
wherein an antenna is in at least one of the bumper brackets.

* * * * *